United States Patent [19]

Chalfin et al.

[11] Patent Number: 4,467,191

[45] Date of Patent: Aug. 21, 1984

[54] PHOTO DIODE WITH AUXILIARY PHOTO DIODE REGULATOR

[75] Inventors: Edward Chalfin, Shrewsbury, Mass.; Walter S. Gontowski, Jr., Thompson, Conn.

[73] Assignee: Sprague Electric Company, North Adams, Mass.

[21] Appl. No.: 344,449

[22] Filed: Feb. 1, 1982

Related U.S. Application Data

[63] Continuation-in-part of Ser. No. 339,032, Jan. 13, 1982.

[51] Int. Cl.$^3$ .............................................. H01J 40/14
[52] U.S. Cl. ................................ 250/214 A; 307/311; 330/308
[58] Field of Search ............ 250/214 P, 214 C, 214 A, 250/214 R; 330/288, 308; 307/311

[56] References Cited

U.S. PATENT DOCUMENTS 4,085,411  4/1978  Genesi .......................... 250/214 P X
4,118,621  10/1978 Monticelli et al. ............. 330/228 X
4,199,753  4/1980  Gontowski, Jr. ............... 307/311 X

OTHER PUBLICATIONS

Monticelli, "A Versatile Monolithic IC Building-Block for Light-Sensing Applications", IEEE Journal of Solid-State Circuits; vol. SC-13; No. 6; Dec. 1978; pp. 873–881.

*Primary Examiner*—David C. Nelms
*Assistant Examiner*—Edward P. Westin

[57] ABSTRACT

An integrated circuit photo sensor has a principal photo diode whose reverse voltage is maintained at a low and relatively invariant value by a circuit comprised of a biasing diode string in series with a small auxiliary photo diode and an emitter follower coupling the diode string bias voltage to the principal photo diode. This results in reliable starting without contributing a DC component of current in the power supply so this circuit is suitable for use in a linear two-terminal-type integrated-circuit photo sensor.

6 Claims, 1 Drawing Figure

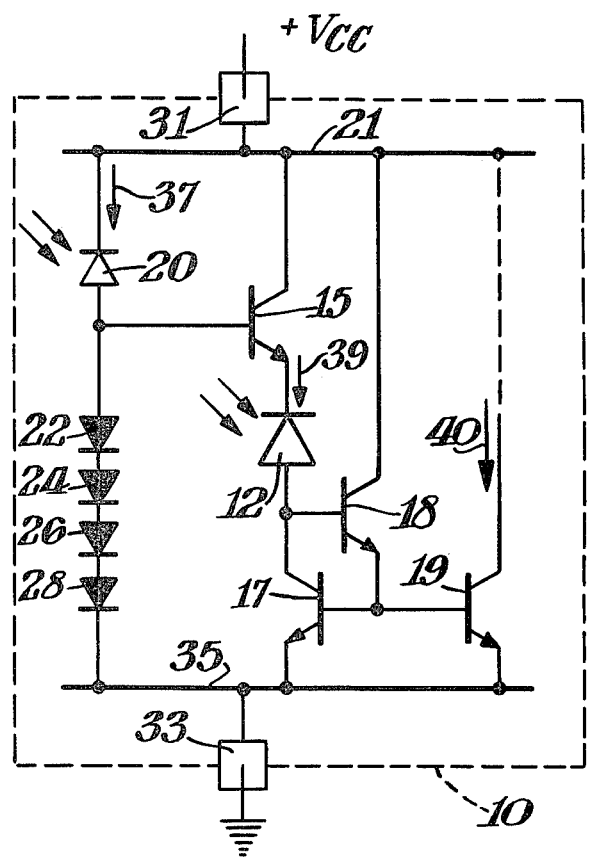

PHOTO DIODE WITH AUXILIARY PHOTO DIODE REGULATOR

CROSS REFERENCE TO RELATED APPLICATION

This application is a continuation in part of patent application Ser. No. 339,032 filed Jan. 13, 1982.

BACKGROUND OF THE INVENTION

This invention relates to a photo sensor with bias regulator to keep a photo diode reverse voltage low and relatively invariant with supply voltage changes and more particularly relates to such a regulator that is controlled by an auxiliary photo diode.

Photo diode voltage regulators are described by R. Genesi in his U.S. Pat. No. 4,085,411, issued Apr. 18, 1978, and by W. Gontowski, Jr. in his U.S. Pat. No. 4,199,753 issued Apr. 22, 1980. Another is described by W. Gontowski, Jr. and E. Chalfin in the above noted parent patent application. Those two patents and that application are assigned to the same assignee as is the present application. By means of a photo-diode-current feedback circuit, the Genesi circuit holds the reverse voltage across the photo diode near zero for a wide range of light intensities and thus a wide range of photo-diode currents so that sharp changes in light intensity are faithfully followed without delay in the photocurrent. The Gontowski regulator consists in a modified current mirror type current source that electrifies a $V_{BE}$-multiplier circuit providing a log-log noise transfer function from the DC supply to the photo diode. Both of these circuits inherently draw a DC component of current from the DC power supply.

A photo sensor including a photo diode and a current mirror amplifier is described in the parent patent application. There the photo diode is connected between the input of the first current mirror stage to the input of a subsequent stage, both stages being formed of one polarity-type transistors; e.g. NPN. A low photo-diode reverse voltage may be achieved in this way, which voltage is also substantially invariant with changes in supply voltage. This simple photo diode biasing method furthermore does not draw any standby current when there is no ambient light and does not draw a DC component of current from the power supply. It may, however, be subject to oscillations or may not start under the conditions that the DC power is applied slowly rather than being switched on.

It is therefore an object of this invention to provide a stable photo sensor that requires no steady start current, draws no other DC component from the DC power supply and starts reliably however the supply voltage is applied.

It is further object of this invention to provide such a linear two-terminal type photo sensor that draws from the DC supply a current that is directly proportional to the ambient light intensity.

SUMMARY OF THE INVENTION

A photo sensor is made up of a principal photo diode, an auxiliary photo diode, a current mirror amplifier, a string of series connected bias diodes, an emitter follower and a pair of DC supply busses. The auxiliary photo diode is connected to acquire a reverse current polarity from one of the busses through the forward biased diodes string to the other bus. The base of the emitter follower is connected to a circuit point between the auxiliary photo diode and the diodes string. The output of the emitter follower, the emitter, is connected to one end of the principal photo diode which is to acquire a reverse current polarity. The other end of the principal photo diode is connected to the input of the current mirror amplifier.

It is preferred to construct the photo sensor of this invention as an integrated circuit. The input stage of the current mirror amplifier has the emitters of the gain controlling transistors connected to the above mentioned other bus and the bias voltage across the principal photo diode is just one $V_{BE}$ drop as may be determined from inspection of the circuit diagram. The auxiliary photo diode preferably occupies less than a tenth of the integrated circuit area than does the principal photo diode. Under these conditions and for levels ranging over at least six orders of magnitude, the reverse bias voltage across the principal photo diode is less than half a volt.

The bias voltage developed across the diodes string is derived from the photo diode current generated by the auxiliary photo diode. Thus the amplitude of this bias current is proportional to the ambient light intensity so there is no DC component contributed by it to the DC supply busses.

This circuit is especially well suited for use in a two terminal type photo sensor as is described by Gontowski in U.S. Pat. No. 4,439,673, issued Mar. 27, 1984, that is assigned to the same assignee as is the present invention.

The present invention provides a circuit wherein there is no positive feedback and oscillations do not tend to occur at even the lowest light levels, and wherein the sensor starts every time even when the supply voltage is turned on gradually.

BRIEF DESCRIPTION OF THE DRAWING

There is shown in the drawing a circuit diagram of an integrated circuit photo sensor of this invention.

DESCRIPTION OF THE PREFERRED EMBODIMENTS

With reference to the FIGURE, an integrated circuit 10, includes a photo diode 12 that is connected between the output of an emitter follower, namely transistor 15 and the input of a current mirror amplifier consisting of transistors 17, 18 and 19. An auxiliary photo diode 20 of smaller size has the cathode connected to the positive DC supply bus 21 and the anode connected to one end of a series string of forward biased diodes 22, 24, 26 and 28. The positive DC supply bus 21 is connected to the integrated circuit terminal pad 31 to which a positive DC supply voltage $+V_{cc}$ is to be applied with respect to the pad 33 that is connected by the ground bus 35.

A bias current 37 flows through the four diodes 22, 24, 26 and 28 producing a voltage drop, $$V_{ds} = 4V_t \ln(I_{37}/I_0)$$

The term $V_T$ is the thermal voltage $KT/q$ which amounts to about 0.026 volts at room temperature, and $I_o$ is the reverse saturation current of the base-emitter junction. This voltage $V_{ds}$ is applied to the cathode of the principal photo diode 12, minus the base-emitter drop in emitter-follower transistor 15.

In a working prototype sensor, the areas of the photo diodes 12 and 20 are in the ratio of 20:1. Thus for any given ambient light intensity, the principal photo current 39 is twenty times larger and $$I_{39}/I_{37} = 20$$

The principal photo diode 12 is in a circuit loop including the four biasing diodes 22, 24, 26 and 28; the base-emitter junction of transistor 15; the base emitter junctions of transistors 18 and 17. The base-emitter junction periphery of transistor 19 is three times greater (3 mils) than that of transistor 17 to provide in this current mirror stage a current gain of 3. The reverse voltage $V_{pd}$ applied to the photo diode 12 is therefore the four biasing diode drops minus the base-emitter junction drops of transistors 15, 18 and 17. By inspection this voltage $V_{pd}$ is a single $V_{BE}$. More quantitatively, the photo diodes voltage $$V_{pd} = 4V_T \ln (I_{39}/20I_0) - V_T \ln (I_{39}/I_0) - V_T \ln (4I_{39}/\beta I_0) - V_T \ln (I_{39}/I_0)$$

and $$V_{pd} = V_T \ln (I_{39}/I_0) - 4V_T \ln 20 - V_T \ln 4 + V_T \ln \beta.$$

Assigning values $\beta_{17} = 100$, $I_{39} = 350 \times 10^{-9}$ amp, $I_0 = 10^{-16}$ amp. and using the relationship $V_T = 0.026$ volts, then $V_{pd} = 0.340$ volts. And this voltage $V_{pd}$ goes from 0.055 to 0.42 when the photo current $I_{39}$ changes from a dark 3.5 nanoamps to a bright 3.5 milliamps. Thus the back voltage across photo diode 12 is kept low and substantially invariant with changes in power supply voltage $V_{cc}$ and changes in light level. Furthermore at the high current (3.5 ma), the DC supply voltage (the "head room") may be as low as 2.7 volts for linear operations. Also all of the branch currents 37, 39 and the output current 40 are proportional to the ambient light level and there is no DC current component in the net power supply current. In total darkness there is no standby current, but starting occurs reliably when light strikes the auxiliary diode 20. Thus the photo sensor of this invention may be a stable two-terminal type sensor as is the sensor of the above noted U.S. Pat. No. 4,439,673.

What is claimed is:

1. A photo sensor comprising a principal photo diode, a current mirror amplifier, an auxiliary photo diode, a string of series connected bias diodes, an emitter follower and a pair of DC supply busses, said auxiliary photo diode being connected from one of said busses in the reverse current polarity in series with said bias diodes string in the forward current polarity to the other of said busses, the input of said emitter follower being connected at a circuit point between said bias diodes string and said auxiliary photo diode, said principal photo diode being connected in the reverse current polarity between the output of said emitter follower and the input of said current mirror amplifier.

2. The photo sensor of claim 1 wherein said photo sensor is an integrated circuit.

3. The photo sensor of claim 2 wherein said principal photo diode occupies at least 10 times more of said integrated circuit surface area than does said auxiliary photo diode.

4. The photo sensor of claim 2 wherein said current mirror amplifier has a first current mirror stage including a pair of gain controlling transistors having disparate base-emitter junction areas and in said first stage, the emitters of said gain controlling transistors are connected to said other bus and the reverse bias voltage across said principal photo diode is held substantially constant at one $V_{BE}$ drop.

5. The photo sensor of claim 4 wherein said reverse bias voltage is less than half a volt for levels of principal photo diode current ranging over at least six orders of magnitude which corresponds to a range of at least six orders of magnitude of the ambient light intensity.

6. The photo sensor of claim 2 wherein said integrated circuit has only two terminal pads to which an external DC energizing supply may be attached, to which said busses are internally connected, and through which the amplified photo current may flow, and thus the current through said bias diodes string is proportional to the amplified current from said principal photo diode adding to it to form the supply current flowing through said terminals without contributing a DC component.

* * * * *